（12） United States Patent
Zheng et al.

(10) Patent No.: US 9,344,112 B2
(45) Date of Patent: May 17, 2016

(54) SAMPLING BASED ELIMINATION OF DUPLICATE DATA

(76) Inventors: Ling Zheng, Sunnyvale, CA (US);
Roger Stager, Sunnyvale, CA (US);
Craig Johnston, Sunnyvale, CA (US);
Don Trimmer, Sunnyvale, CA (US);
Yuval Frandzel, Sunnyvale, CA (US)

( * ) Notice: Subject to any disclaimer, the term of this patent is extended or adjusted under 35 U.S.C. 154(b) by 1026 days.

(21) Appl. No.: 13/443,650

(22) Filed: Apr. 10, 2012

(65) Prior Publication Data

US 2012/0197853 A1    Aug. 2, 2012

Related U.S. Application Data

(63) Continuation of application No. 11/414,600, filed on Apr. 28, 2006, now Pat. No. 8,165,221.

(51) Int. Cl.
*H04N 7/18* (2006.01)
*H03M 7/00* (2006.01)
*H04N 19/20* (2014.01)
*H04N 19/23* (2014.01)
*H04N 19/25* (2014.01)

(52) U.S. Cl.
CPC .............. *H03M 7/00* (2013.01); *H04N 19/004* (2013.01); *H04N 19/00387* (2013.01); *H04N 19/00406* (2013.01)

(58) Field of Classification Search
CPC .......... H04N 19/00387; H04N 19/004; H04N 19/00406; H04N 19/00945; H04N 19/00921
USPC ........................................ 375/240.11–240.26
See application file for complete search history.

(56) References Cited

U.S. PATENT DOCUMENTS

| | | |
|---|---|---|
| 4,082,479 A | 4/1978 | Rangi et al. |
| 4,180,372 A | 12/1979 | Lippert |
| 4,247,259 A | 1/1981 | Seki et al. |
| 4,570,217 A | 2/1986 | Allen et al. |
| 4,595,336 A | 6/1986 | Grose |
| 5,009,571 A | 4/1991 | Smith |
| 5,124,987 A | 6/1992 | Milligan et al. |
| 5,163,131 A | 11/1992 | Row et al. |
| 5,193,978 A | 3/1993 | Gutierrez |
| 5,202,979 A | 4/1993 | Hillis et al. |
| 5,278,979 A | 1/1994 | Foster et al. |

(Continued)

FOREIGN PATENT DOCUMENTS

| | | |
|---|---|---|
| EP | 0 683 316 | 11/1995 |
| EP | 1349 089 | 1/2003 |

(Continued)

OTHER PUBLICATIONS

U.S. Appl. No. 11/105,895, filed Apr. 13, 2005, Zheng et al.

(Continued)

*Primary Examiner* — Andy Rao
(74) *Attorney, Agent, or Firm* — Gilliam IP PLLC (57) ABSTRACT

A technique for eliminating duplicate data is provided. Upon receipt of a new data set, one or more anchor points are identified within the data set. A bit-by-bit data comparison is then performed of the region surrounding the anchor point in the received data set with the region surrounding an anchor point stored within a pattern database to identify forward/backward delta values. The duplicate data identified by the anchor point, forward and backward delta values is then replaced in the received data set with a storage indicator.

19 Claims, 5 Drawing Sheets

(56) References Cited

U.S. PATENT DOCUMENTS

| | | | |
|---|---|---|---|
| 5,324,169 A | 6/1994 | Brown et al. | |
| 5,403,667 A | 4/1995 | Simoens | |
| 5,581,724 A | 12/1996 | Belsan et al. | |
| 5,732,265 A | 3/1998 | Dewitt et al. | |
| 5,819,292 A | 10/1998 | Hitz et al. | |
| 5,907,672 A | 5/1999 | Matze et al. | |
| 5,990,810 A | 11/1999 | Williams | |
| 6,061,770 A | 5/2000 | Franklin | |
| 6,081,875 A | 6/2000 | Clifton et al. | |
| 6,289,451 B1 | 9/2001 | Dice | |
| 6,341,341 B1 | 1/2002 | Grummon et al. | |
| 6,374,266 B1 | 4/2002 | Shnelvar | |
| 6,892,211 B2 | 5/2005 | Hitz | |
| 6,912,645 B2 | 6/2005 | Dorward et al. | |
| 6,970,513 B1* | 11/2005 | Puri et al. | 375/240.25 |
| 7,010,553 B2 | 3/2006 | Chen et al. | |
| 7,043,485 B2 | 5/2006 | Manley et al. | |
| 7,072,910 B2 | 7/2006 | Kahn et al. | |
| 7,079,053 B2 | 7/2006 | Kolavi | |
| 7,103,602 B2 | 9/2006 | Black et al. | |
| 7,124,305 B2 | 10/2006 | Margolus et al. | |
| 7,127,577 B2 | 10/2006 | Koning et al. | |
| 7,162,662 B1 | 1/2007 | Svarcas et al. | |
| 7,289,643 B2 | 10/2007 | Brunk et al. | |
| 7,289,886 B1 | 10/2007 | Woytowitz | |
| 7,305,557 B2 | 12/2007 | Albornoz et al. | |
| 7,333,993 B2 | 2/2008 | Fair | |
| 7,475,098 B2 | 1/2009 | Patterson et al. | |
| 7,516,286 B1 | 4/2009 | Dalal et al. | |
| 7,567,188 B1 | 7/2009 | Anglin et al. | |
| 7,698,532 B1 | 4/2010 | Gonzalez | |
| 7,752,384 B2 | 7/2010 | Moody et al. | |
| 8,107,527 B1* | 1/2012 | Hobbs et al. | 375/240.01 |
| 2002/0107877 A1 | 8/2002 | Whiting et al. | |
| 2002/0194529 A1 | 12/2002 | Doucette et al. | |
| 2003/0123983 A1 | 7/2003 | Bolduc | |
| 2004/0030668 A1 | 2/2004 | Pawlowski et al. | |
| 2004/0083245 A1 | 4/2004 | Beeler | |
| 2006/0020804 A1 | 1/2006 | Schleifer et al. | |
| 2007/0050423 A1 | 3/2007 | Whalen et al. | |
| 2007/0255758 A1 | 11/2007 | Zheng et al. | |
| 2008/0005141 A1 | 1/2008 | Zheng | |
| 2008/0005201 A1 | 1/2008 | Ting | |
| 2008/0133561 A1 | 6/2008 | Dubnicki et al. | |
| 2008/0301134 A1 | 12/2008 | Miller | |

FOREIGN PATENT DOCUMENTS

| | | |
|---|---|---|
| IN | 938/DEL/2007 | 4/2007 |
| WO | WO 02/08956 | 1/2002 |
| WO | WO 2007/0127360 | 11/2007 |
| WO | WO 2008/005211 | 1/2008 |
| WO | WO 2008/005212 | 1/2008 |
| WO | WO 2008/153821 | 12/2008 |

OTHER PUBLICATIONS

Akyurek, Sedat, Placing Replicated Data to Reduce Seek Delays, Department of Computer Science, University of Maryland, UMIACS-TR-91-121, CS-TR-2746, Aug. 1991.

Bilenko, Mikhail et al. "Adaptive Duplicate Detection Using Learnable String Similarity Measures". Published in Proceedings of the Ninth ACM SIGKDD International Conference on Knowledge, Aug. 23, 2003, pp. 1-10.

Bitton, Dina, Disk Shadowing, Proceedings of the 14.sup.th VLDB Conference, LA, CA (1988), 8 pages.

Business Wire, Sepaton Announces Next Generation Data De-Duplication Software; Delivers Industry's Highest Level of De-Duplication Without Affecting Backup Performance, Business Wire, May 2006, 3 pages.

Chaudhuri, Surajit, et al., Self-Tuning Technology in Microsoft SQL Server, Data Engineering Journal 22, Feb. 1999 pp. 20-27.

Chutani, Sailesh, et al., The Episode File System, In Proceedings of the USENIX Winter 1992, 18 pages.

Coyne, Robert A. et al., Storage Systems for National Information Assets, Proc. Supercomputing 92, Minneapolis, Nov. 1992, pp. 626-633.

Crochemore, Maxime et al., "Pattern Matching and Text Compression Algorithms", dated Jan. 8, 2003, retrieved from http://citeseer.comp.nus.edu.sg/595025.html, 50 pages.

EMC2, Celerra File Server Architecture for High Availability, EMC2 Corporation, Aug. 1999, 12 pages.

Finlayson, Ross S., et al., Log Files: An Extended File Service Exploiting Write-Once Storage Department of Computer Science, Stanford University, Report No. STAN-CS-87-1177, Sep. 1987, 14 pages.

Gray, Jim, et al., The Recovery Manager of the System R Database Manager, ACM Computing Surveys, (13)2:223-242 1981, 20 pages.

Hecht, Matthew S., et al. Shadowed Management of Free Disk Pages with a Linked List, ACM Transactions on Database Systems, 8/4, Dec. 1983, pp. 503-514.

Hernandez, Mauricio A. et al. "Real-world Data is Dirty: Data Cleansing and the Merge/Purge Problem". Published in Data Mining and Knowledge Discovery, vol. 2, pp. 1-31 (48 pages).

Hitz, Dave et al., File System Design for an NFS File Server Appliance, Technical Report 3002, Rev. C3/95, presented Jan. 19, 1994, USENIX Winter 1994, 23 pages.

Hong, et al., Duplicate Data Elimination in a SAN File System, Proceedings of the 21st IEEE / 12th NASA Goddard Conference on Mass Storage Systems and Technologies (2004), 304-314.

Howard, John H, et al., Scale and Performance in a Distributed File System, Carnegie Mellon University, CMU-ITC-87-068, Aug. 5, 1987, 33 pages.

Howard, John H., An Overview of the Andrew File System, Carnegie Mellon University, CMU-ITC-88-062 1988, 6 pages.

Howard, John, H. et al., Scale and performance in a distributed file system, ACM Trans. Computer. System., 6(1), Feb. 1988 pp. 51-81.

Kazar, Michael L., et al., Decorum File System Architectural Overview, USENIX Summer Conference, Anaheim, California, 1990, 13 pages.

Kazar, Michael L., Synchronization and Caching Issues in the Andrew File System, Carnegie Mellon University, CMU-ITC-88-063, 12 pages.

Kemper, Alfons, et al., Performance Tuning for SAP R/3, Data Engineering Journal 22, Feb. 1999 pp. 33-40.

Kent, Jack et al., Optimizing Shadow Recovery Algorithms, IEEE Transactions on Software Engineering, 14(2): 155-168, Feb. 1988.

Kistler, et al., Disconnected Operation in the Coda File System, ACM Transactions on Computer Systems, vol. 10, No. 1, Feb. 1992, pp. 3-25.

Lee, Mong Li et al. "IntelliClean: a Knowledge-based Intelligent Data Cleaner", published by ACM International Conference on Knowledge Discovery and Data Mining, pp. 290-294.

Lorie, Raymond, A, Physical Integrity in a large segmented database, ACM Trans. Database Systems, 2(1): 91-104, Mar. 1977.

Muthitacharoen, Athicha, et al., "A Low-bandwidth Network File System," ACM SOSP. Proceedings of the ACM Symposium on Operating Systemprinciples, ACM, US, XP-002405303, Oct. 21, 2002, pp. 174-187.

National Institute of Standards and Technology, Federal Information Processing Standards Publication: The Keyed-Hash Message Authentication Code (HMAC), FIPS PUB 198, Information Technology Laboratory, Gaithersburg, Maryland, Mar. 2002, 20 pages.

Notification of Transmittal of the International Search Report and the Written Opinion of the International Searching Authority, or the Declaration, Mailed from the European Patent Office on Apr. 9, 2008, 12 pages.

Notification of Transmittal of the International Search Report and the Written Opinion of the International Searching Authority, or the Declaration, International Filing Date: Apr. 26, 2007, International Application No. PCT/US2007/010222, Applicant: Network Appliance, Inc., Date of Mailing: Apr. 15, 2008, pp. 1-15.

Notification of Transmittal of the International Search Report and the Written Opinion of the International Searching Authority, or the Declaration, International Filing Date: Jun. 25, 2007, International Application No. PCT/US2007/014664, Applicant: Network Appliance, Inc., Date of Mailing: Apr. 9, 2008, pp. 1-12.

(56) References Cited

OTHER PUBLICATIONS

Notification of Transmittal of the International Search Report and the Written Opinion of the International Searching Authority, or the Declaration, International Filing Date: Jun. 25, 2007, International Application No. PCT/US2007/014666, Applicant: Network Appliance, Inc., Date of Mailing: Feb. 22, 2008, pp. 1-18.

"Notification of Transmittal of the International Search Report and the Written Opinion of the International Searching Authority, or the Declaration," International Filing Date: May 29, 2008, International Application No. PCT/US2008/006805, Applicant: Network Appliance, Inc., Date of Mailing: Oct. 27, 2008, pp. 1-15.

Ousterhout, John et al., Beating the I/O Bottleneck: A Case for Log-Structured File Systems, Technical Report, Computer Science Division, Electrical Engineering and Computer Sciences, University of California at Berkeley, Oct. 30, 1988, 18 pages.

Patterson, D., et al., A Case for Redundant Arrays of Inexpensive Disks (RAID), Technical Report, CSD-87-391, Computer Science Division, Electrical Engineering and Computer Sciences, University of California at Berkeley (1987), 26 pages.

Patterson, D., et al., A Case for Redundant Arrays of Inexpensive Disks (RAID), SIGMOD International Conference on Management of Data, Chicago, IL, USA, Jun. 1-3, 1988, SIGMOD Record (17):3:109-16 (Sep. 1988).

Peterson, Zachary Nathaniel Joseph, Data Placement for Copy-on-Write Using Virtual Contiguity, University of CA, Santa Cruz, Master of Science in Computer Science Thesis, Sep. 2002.

Quinlan, Sean, A Cached WORM File System, Software-Practice and Experience, 21(12):1289-1299 (1991).

Reichenberger, Christoph "Delta Storage for Arbitrary Non-Text Files", published in Proceedings of the 3rd International Workshop on Software Configuration Management, Jun. 12-14, 1991, pp. 144-152.

Reichenberger, Chris; "Delta Storage for Arbitrary Nontext Files"; Proceedings of the 3rd International Workshop on Software Configuration Management; Trondheim, Norway, Jun. 1999; ACM, pp. 144-152.

Rosenblum, Mendel, et al. The Design and Implementation of a Log-Structured File System Jul. 24, 1991 pp. 1-15.

Rosenblum, Mendel, The Design and Implementation of a Log-Structured File System, 1992, pp. 1-93.

Rosenblum, Mendel, et al., The Design and Implementation of a Log-Structured File System, In Proceedings of ACM Transactions on Computer Systems, (10)1:26-52, Feb. 1992.

Rosenblum, Mendel, et al., The LFS Storage Manager, Computer Science Division, Electrical Engin. and Computer Sciences, Univ. of CA, presented at Summer '90 USENIX Technical Conference, Anaheim, CA Jun. 1990, 16 pages.

Schiefer, Berni, et al., DB2 Universal Database Performance Tuning, Data Engineering Journal 22, Feb. 1999 pp. 12-19.

Seltzer, Margo I., et al., Journaling Versus Soft Updates: Asynchronous Meta-Data Protection in File Systems, Proceedings of 200 USENIX Annual Technical Conference, Jun. 18-23, 2000.

Shasha, Dennis, Tuning Time Series Queries in Finance: Case Studies and Recommendations, Data Engineering Journal 22, Feb. 1999 pp. 41-47.

Sidebotham, Bob, Volumes: The Andrew File System Data Structuring Primitive, EEUG Conference Proceedings, Manchester, UK, Autumn 1986.

Subramanian, Muralidhar, et al., Performance Challenges in Object-Relational DBMSs, Data Engineering Journal 22, Feb. 1999 pp. 28-32.

Weikum, Gerhard, et al., Towards Self-Tuning Memory Management for Data Servers, Data Engineering Journal 22, Feb. 1999 pp. 3-11.

West, Michael, et al. The ITC Distributed File System: Prototype and Experience, Carnegie-Mellon University, Technical Report CMU-ITC-040, Mar. 1985, 17 pages.

Zayas, Edward R., AFS-3 Programmer's Reference: Architectural Overview, Transarc Corporation, Pittsburgh, PA, 1.0 edition 1991, 37 pages.

\* cited by examiner

SAMPLING BASED ELIMINATION OF DUPLICATE DATA

CROSS-REFERENCE TO RELATED APPLICATION

The present application is a continuation of U.S. Ser. No. 11/414,600 filed by Ling Zheng et al. on Apr. 28, 2006 now U.S. Pat. No. 8,165,221, the contents of which are hereby incorporated by reference.

FIELD OF THE INVENTION

The present invention relates generally to data storage compression and, more specifically, sampling based elimination of duplicate data (de-duplication).

BACKGROUND OF THE INVENTION

A storage system typically comprises one or more storage devices into which information may be entered, and from which information may be obtained, as desired. The storage system includes a storage operating system that functionally organizes the system by, inter alia, invoking storage operations in support of a storage service implemented by the system. The storage system may be implemented in accordance with a variety of storage architectures including, but not limited to, a network-attached storage environment, a storage area network and a disk assembly directly attached to a client or host computer. The storage devices are typically disk drives organized as a disk array, wherein the term "disk" commonly describes a self-contained rotating magnetic media storage device. The term disk in this context is synonymous with hard disk drive (HDD) or direct access storage device (DASD).

Data storage is a central part of many industries that operate in archival and compliance application environments, such as banks, government facilities/contractors and securities brokerages. In many of these environments, it is necessary to store selected data, e.g., electronic-mail messages, financial documents and/or transaction records, in an immutable manner, possibly for long periods of time. Typically, data backup operations are performed to ensure the protection and restoration of such data in the event of a failure. However, backup operations often result in the duplication of data on backup storage resources, such as disks, causing inefficient consumption of the storage space on the resources. One form of long term archival storage is the storage of data on electronic tape media. A noted disadvantage of physical tape media is the slow data access rate and the added requirements for managing a large number of physical tapes. In response to these noted disadvantages, several storage system vendors provide virtual tape library (VTL) systems that emulate tape storage devices using a plurality of the disk drives. In typical VTL environments, the storage system serving as the primary storage performs a complete backup operation of the storage system's file system (or other data store) to the VTL system. Multiple complete backups may occur over time thereby resulting in an inefficient consumption of storage space on the VTL system. It is thus desirable to eliminate duplicate data on the storage resources, such as disks associated with a VTL system, and ensure the storage of only single instance of data to thereby achieved storage compression.

One technique for achieving a reduction in data duplication (de-duplication) is described in U.S. Pat. No. 5,990,810, entitled METHOD FOR PARTITIONING A BLOCK OF DATA INTO BLOCKS AND FOR STORING AND COMMUNICATING SUCH SUBBLOCKS, by Ross Williams, issued Nov. 23, 1999 (hereafter "the '810 patent"). The method described in the '810 patent first utilizes a rolling hash function to generate a plurality of sub-blocks of data. The rolling hash utilizes a fixed size window of data that results in a boundary being placed between two sub-blocks. Once a block of data has been partitioned into sub-blocks, the hash value of each sub-block is calculated to form a table of hash values. The hash table is then used to determine if a new sub-block is identical to any sub-block whose hash value has previously been stored in the hash table. To perform this determination, the new sub-block's hash value is calculated and compared with the values contained in the hash table. If a the new sub block's hash value has been previously stored within the hash table, then the sub block identified with the stored hash value is considered as identical with the new sub block. In such a case, the new sub block is replaced with a pointer to the previously stored sub block, thereby reducing the amount of storage space required for the sub block. A noted disadvantage of the technique described in the '810 patent is that it requires performance of an extensive number of computationally intensive hashing calculations, which may affect the overall performance of a storage/VTL system implementing such a method. Another noted disadvantage is that the hash table will become larger as the size of data set increases and may not scale to large data sets such as terabytes or petabytes of data.

Another technique for eliminating duplicate data is described in U.S. patent application Ser. No. 11/105,895, filed on Apr. 13, 2005 entitled METHOD AND APPARATUS FOR IDENTIFYING AND ELIMINATING DUPLICATE DATA BLOCKS AND SHARING DATA BLOCKS IN A STORAGE SYSTEM, by Ling Zheng et al. In the system described in this patent application, all data de-duplication operations are performed on fixed size blocks that are illustratively 4 kilobytes (KB) in size. When a new block is to be stored, a hash is computed of the 4 KB block and compared with a hash table containing hash values of previously stored blocks. Should the new block's hash value be identical to the previously stored block, there is a high degree of probability that the new block is identical to the previously stored block. In such a case, the new block is replaced with a pointer to the previously stored block, thereby reducing storage resource consumption. However, a noted disadvantage of this system is that it is limited to fixed size blocks. In operation a single bit addition in the middle of a data set may cause misalignment of all subsequent blocks and prevent de-duplication, thereby causing an inefficient use of storage resources.

A third technique, as mentioned in DELTA STORAGE FOR ARBITRARY NONTEXT FILES by Chris Reichenberger, In Proceedings of the 3rd International Work-shop on Software Configuration Management, Trondheim, Norway, 1214 June 1991 (June 1991), ACM, pp. 144-152, is to use the hashes of data to find the longest common data sequence. However, the above method to compute and compare the hashes of all possible substrings in a data set does not employ any sampling technique. Therefore, it will not be scalable for large data sets.

SUMMARY OF THE INVENTION

The present invention overcomes the disadvantages of the prior art by providing a sampling based technique for eliminating duplicate data (de-duplication) stored on storage resources, such as disks. According to the invention, when a new data set, e.g., a backup data stream, is received by a server, e.g., a storage system or virtual tape library (VTL)

system implementing the invention, one or more anchors are identified within the new data set. As used herein, an anchor is defined as a point within the data set that defines a region of interest for potential data de-duplication. Anchors may be located by performing a rolling hash of the data set. In such cases, an anchor point ("anchor") is located within a fixed size region defining a signature width. Anchors may also be selected based on location within data containers, e.g., a file, or other contextual information, e.g., at predefined offsets within the data set.

For each anchor identified in the new data set, a determination is made whether the anchor has been stored previously in an anchor database (or other data store). If it has not been stored in the anchor database, the anchor is then stored within the anchor database along with information identifying its location within the data set. However, in alternate embodiments, the anchor location may simply be an offset within the data set. If the identified anchor was stored previously within the anchor database, then the server locates the anchor within the pattern database and performs a bit-by-bit (or byte-by-byte) data comparison, forwards and backward from the anchor point between the new data set and the data set containing the anchor stored in the pattern database. The result of this data comparison is a forward delta value and a backward delta value identifying the number of consecutive bits of data that match between the new data set and the stored data set forward and backward from the anchor point, respectively. In the new data set, the duplicate data, i.e., the range of data between the backward delta value and the forward delta value around the anchor point, is replaced with a storage indicator that identifies the anchor and the forward and backward delta values.

BRIEF DESCRIPTION OF THE DRAWINGS

The above and further advantages of the invention may be better understood by referring to the following description in conjunction with the accompanying drawings in which like reference numerals indicate identical or functionally similar elements.

DETAILED DESCRIPTION OF AN ILLUSTRATIVE EMBODIMENT

A. Storage System Environment

Figure 1:
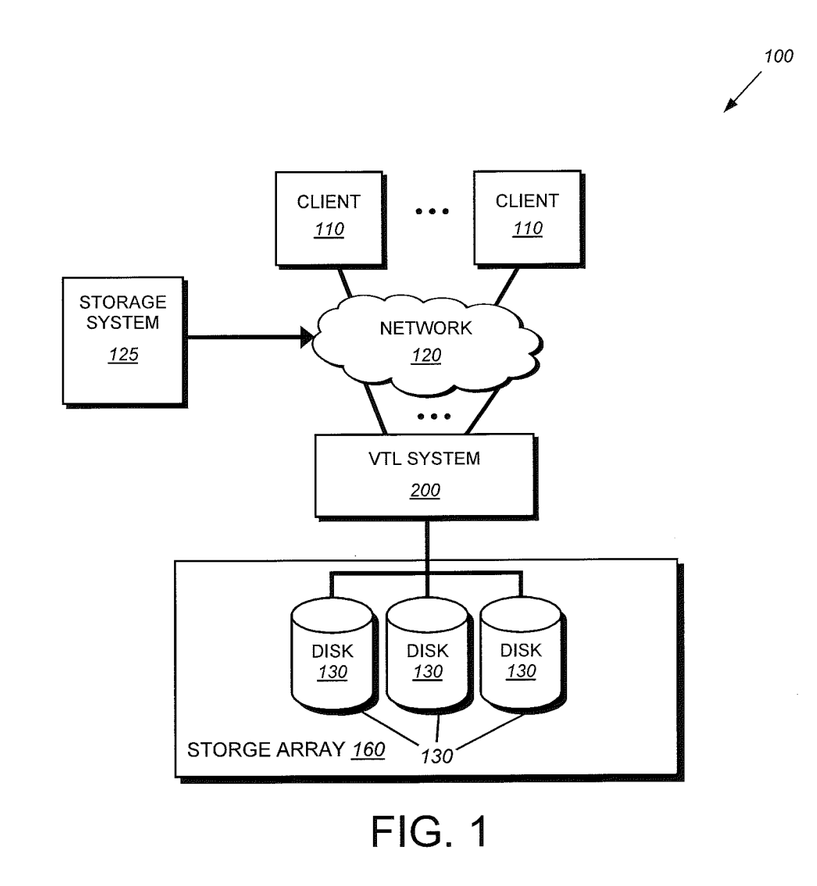
FIG. 1 is a schematic block diagram of an exemplary storage system environment including a virtual tape library (VTL) system in accordance with an embodiment of the present invention.

FIG. 1 is a schematic block diagram of a storage system environment 100 that may be advantageously used with the present invention. The storage system environment 100 comprises a storage system 125 interconnected with a plurality of clients 110 by network 120. Illustratively, the network 120 may be embodied as an Ethernet network or a Fibre Channel (FC) network. Also interconnected with the network 120 is a virtual tape library (VTL) system 200 that illustratively implements the data de-duplication technique of the present invention. Also operatively connected with the VTL system 200 are one or more storage devices, such as disks 130, organized as a storage array 160.

In operation, the storage system 125 services data access requests from the clients 110. Each client 110 may be a general-purpose computer configured to execute applications and interact with the storage system 125 in accordance with a client/server model of information delivery. That is, the client may request the services of the storage system, and the system may return the results of the services requested by the client, by exchanging packets over the network 120. The clients may issue packets including file-based access protocols, such as the Common Internet File System (CIFS) protocol or Network File System (NFS) protocol, over TCP/IP when accessing information, such as data, in the form of data containers, such as files and directories. Alternatively, the client may issue packets including block-based access protocols, such as the Small Computer Systems Interface (SCSI) protocol encapsulated over TCP (iSCSI) and SCSI encapsulated over Fibre Channel (FCP), when accessing information in the form of data containers, such as blocks.

When an administrator of the storage system 125 desires to perform a backup operation, conventional tape backup software may be utilized with the storage system 125 to perform a backup operation to the VTL system 200. The VTL system 200 appears to the storage system 125 as a remote tape drive; thus, the storage system 125 may perform a conventional tape backup operation to the VTL system 200 using conventional tape backup software. Typically, each backup operation results in the copying of the entire file system stored by the storage system 125 to the VTL system 200, e.g., as a "backup". A noted result of such copying is that the VTL system 200 may include significant amounts of duplicated data, i.e., data that remains common among each of the backups of storage system 125 and/or redundant data between backups of different clients 110. The present invention illustratively eliminates the duplicate data in accordance with the novel sampling based data de-duplication technique, described further below.

B. Virtual Tape Library System

Figure 2:
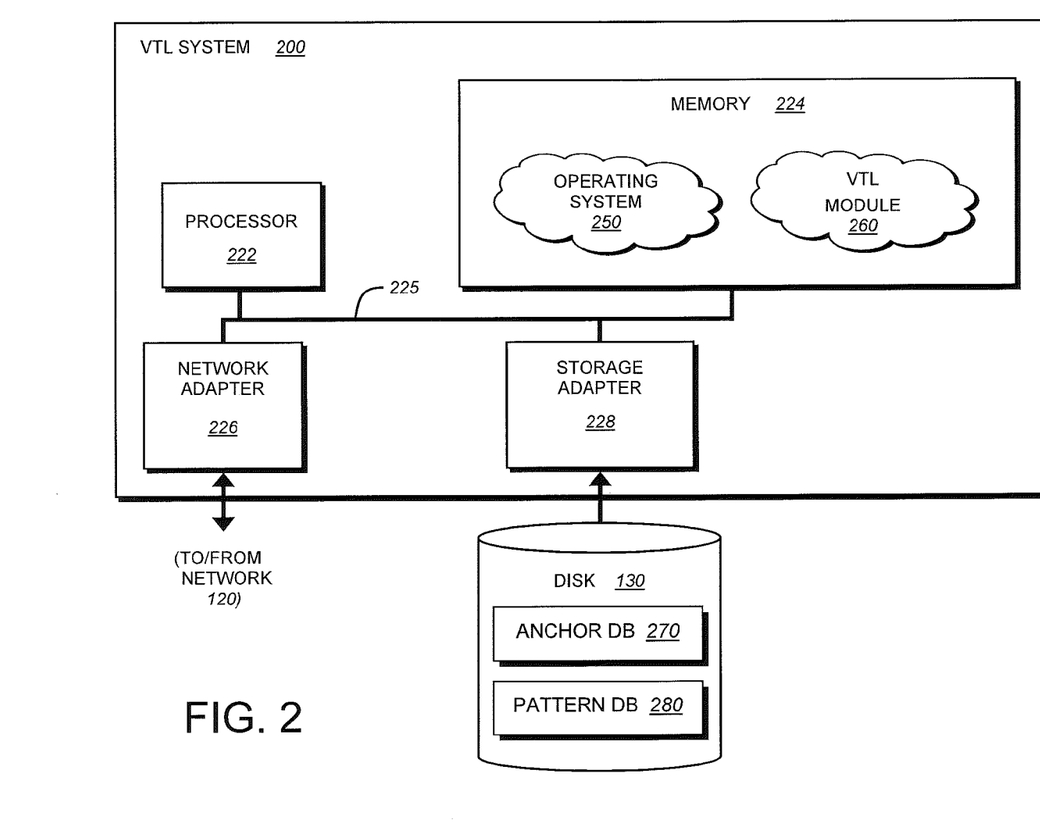
FIG. 2 is a schematic block diagram of a VTL system in accordance with an embodiment of the present invention.

FIG. 2 is a schematic block diagram of a VTL system 200 that may be advantageously used with the present invention. Illustratively, the VTL system 200 is a computer that provides storage service relating to the organization of information on storage devices, such as disks 130 of a local storage (disk) array 160. The VTL system 200 illustratively comprises a processor 222, a memory 224, one or more network adapters 226 and one or more storage adapters 228 interconnected by a system bus 225. Each network adapter 226 comprises the mechanical, electrical and signaling circuitry needed to connect the VTL system 200 to storage system 125 over the network 120. The VTL system 200 also includes an operating system 250 that interacts with various modules, such as virtual tape library (VTL) module 260, described further below. The operating system 250 may implement a logical data object store on disks 130 and for use by applications, such as VTL module 260 executing on the VTL system 200. As described herein, the logical data object store is illustratively embodied as an anchor database (DB) 270 and a pattern DB 280.

In the illustrative embodiment, the memory 224 comprises storage locations that are addressable by the processor and adapters for storing software program code, such as operating system 250 and VTL module 260. The processor and adapters may, in turn, comprise processing elements and/or logic circuitry configured to execute the software code and manipulate the data structures. It will be apparent to those skilled in the art that other processing and memory means, including various computer readable media, may be used for storing and executing program instructions pertaining to the inventive technique described herein.

The storage adapter 228 cooperates with the operating system 250 executing on the VTL system 200 to store and retrieve information requested on any type of attached array of writable storage device media such as video tape, optical, DVD, magnetic tape, bubble memory, electronic random access memory, micro-electro mechanical and any other similar media adapted to store information, including data and parity information. However, as illustratively described herein, the information is preferably stored on the disks 130, such as HDD and/or DASD, of local storage array 160. The storage adapter includes input/output (I/O) interface circuitry that couples to the disks over an I/O interconnect arrangement, such as a conventional high-performance, FC serial link topology.

As noted, the operating system 250 illustratively implements a logical data object store on disks 130. It should be also noted that in alternate embodiments, other forms of data organization may be utilized including, for example, a file system. As such, the description of utilizing a data object store should be taken as exemplary only. Furthermore, the VTL module 260 cooperates with the operating system 250 to implement virtual tape library functionality for the VTL system 200. Illustratively, the VTL module 260 stores data from the using the data object store. Notably, the VTL module 260 also implements the data de-duplication technique of the present invention.

C. Sampling Based Data De-Duplication

The present invention provides a sampling based technique for eliminating duplicate data (de-duplication) stored on storage resources, such as disks 130. According to the invention, when a new data set is received by a server, e.g., storage system 125 or system 200, one or more anchors are identified within the new data set. As used herein, an anchor is defined as a point within the data set that defines a region of interest for potential data de-duplication. Anchors may be located by performing a rolling hash of the data set. In such cases, an anchor point ("anchor") is located within a fixed size region defining a signature width. Anchors may also be selected based on location within a data container, e.g., a file, or other contextual information, e.g., at predefined offsets within the data set. It should be noted that anchors may be identified using a variety of techniques. As such, the techniques described herein should be taken as exemplary only.

For each anchor identified in the new data set, a determination is made whether the anchor has been stored previously in the anchor database 270. If it has not been stored in the anchor database, the anchor is then stored within the anchor database 270 along with information identifying its location within the data set. Illustratively, data sets are stored within the pattern database 250 disposed over implemented on top of, e.g., the data object store. However, in alternate embodiments, the anchor location may simply be an offset within the data set. If the identified anchor was stored previously within the anchor database, then the server locates the anchor within the pattern database 250 and performs a bit-by-bit data comparison, forward and backward from the anchor point, between the new data set and the data set containing the anchor stored in the pattern database 250. The result of this data comparison is a forward delta value and a backward delta value identifying the number of consecutive bits of data that match between the new data set and the stored data set forward and backward from the anchor point, respectfully. In the new data set, the duplicate data, i.e., the range of data between the backward delta value and the forward delta value around the anchor point, is replaced with a storage indicator that identifies the anchor and the forward and backward delta values.

Figure 3:
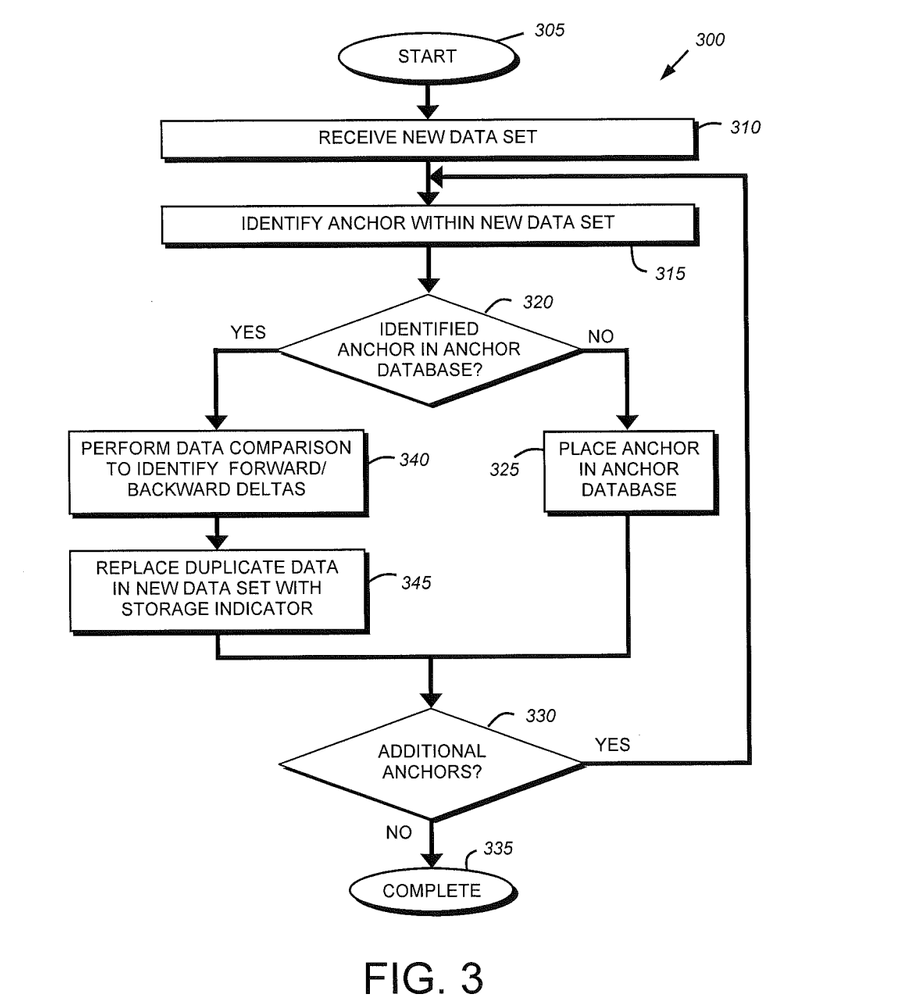
FIG. 3 is a flowchart detailing the steps of a procedure for performing a sampling based data de-duplication procedure in accordance with an embodiment of the present invention.

FIG. 3 is a flowchart detailing the steps of a sampling based data de-duplication procedure 300 in accordance with an illustrative embodiment of the present invention. The procedure 300 begins in step 305 and continues to step 310 where a new data set is received by a server, such as the VTL system 200. In the illustrative environment 100 of FIG. 1, the received data set may comprise a new tape backup data stream directed to the VTL system 200 from the storage system 125. However, in alternate embodiments, any data set may be utilized on any computer including, for example, a file stored within the storage system 125. As such, the description of the data set being a tape backup stream directed to a VTL system 200 should be taken as exemplary only. As noted, in alternate embodiments, any form of data set may be utilized on any computer. Thus, the teachings of the present invention may be utilized in environments different from the below-described VTL system environment.

In response to receiving the new data set, the VTL module 260 identifies one or more anchors within the new data set in step 315. In accordance with the present invention, anchors may be identified in a plurality of ways. One anchor identification technique is to place an anchor at predefined offsets within the data set. These offsets may be fixed or may be based on the type of data within the data set. For example, if the data set is a tape archival backup data stream, an anchor may be placed at the beginning of each record within the data stream. Another exemplary technique for identifying anchors is to perform a rolling hash, using a fixed size window, along the data set. An anchor may then be placed within the window when the hash value (modulo a constant) equals a pre-determined value. For example, a rolling hash using a window size of 512 bits may be utilized. When the hash value, modulo N, equals 0, an anchor point may be located at the beginning of the window.

Once the anchors have been identified, the VTL module 260 then determines whether the identified anchor is located within the anchor database 270 in step 320. If the identified anchor is not stored within the anchor database, the procedure 300 branches to step 325 where the VTL module places the anchor within the anchor database. Certain anchors may not be stored in the anchor database, e.g., anchors that occur too frequently to be of use. The VTL module may be configured with these frequently occurring anchors or may, in alternate embodiments, track frequently occurring anchors to identify those that should not be maintained in the anchor database. Then, in step 330, a determination is made whether additional anchors are within the data set. If so, the procedure 300 loops back to step 315 where the VTL module 260 identifies another anchor within the data set. Otherwise, the procedure 300 completes in step 335.

However, if the identified anchor is located within the anchor database 270, the VTL module 260 then begins a bit-by-bit (or byte-by-byte) comparison of the region surrounding the anchor within the pattern database 280 and the anchor point within the received data set to identify forward and backward delta values (step 340). The delta values identify the number of conservative bits forward/backward from the anchor point that are identical between the region in the pattern database 280 and the received data set. For example, if the data is identical for a thousand bits in front of the anchor point and 15 bits behind the anchor point, then the backward delta value would be set equal to 15 and the forward delta value would be set equal to 1000. It should be noted that in certain situations, depending upon placement of anchors, a particular delta value may be equal to zero. For example, if the anchor point is selected at the beginning of the window utilized by the rolling hash, no bits prior to the anchor point may match with the pattern database. The backward/forward delta values ("deltas") typically encompass the width of the sliding hash window; however, this is not a requirement of the present invention. By utilizing the anchor point along with forward and backward deltas, a region of duplicate data may be identified i.e., the data that ranges from the backward delta (number of bits) behind the anchor point to the forward delta (number of bits) in front of the anchor point. According to the invention, this identified region of duplicate data may be eliminated from the storage, thereby achieving compression and improving the efficiency of the use of storage resources.

In step 345, the identified region of duplicate data in the new data set is then replaced with a storage indicator. Illustratively, the storage indicator identifies the anchor as well as the forward and backward deltas. Compression of the data set is obtained when the storage indicator is of a smaller size then the duplicate data being replaced. Thus, depending upon implementation details, a minimum size may be required before duplicate data is replaced. For example, if a storage indicator requires 256 bits, unless (forward delta value+backward delta value)>256, no compression will occur. It should be noted that in alternate embodiments, the system may include an administrator controlled threshold for minimum size before replacement occurs. Such a threshold may enable the administrator to tune the performance of the system based on the nature of the expected data. Thus, the system may include both a static, e.g., size of storage indicator, and dynamic, e.g., administrator set, thresholds. Again, if there are no additional anchors in the data set, the procedure completes in step 335.

During step 340, the region of duplicate data being identified may have additional anchor points in this region. However, those anchor points would not need to be processed by step 315. The next anchor point to be processed will be in the new data after the identified region of duplicate data. Further, the skipped anchor points might not need to be calculated using the anchor identification technique. The set of new anchor points in the duplicate data region will be the same as the set in the original data region. The performance benefit is that relatively few anchor points will have to be calculated and processed when processing long streams of matching data.

Additionally, if duplicate data could be identified before writing the new data to the storage server, the new duplicate data may not need to be written to the VTL system 200 at all. This would have the benefit of reduced I/O operations over the network.

Figure 4:
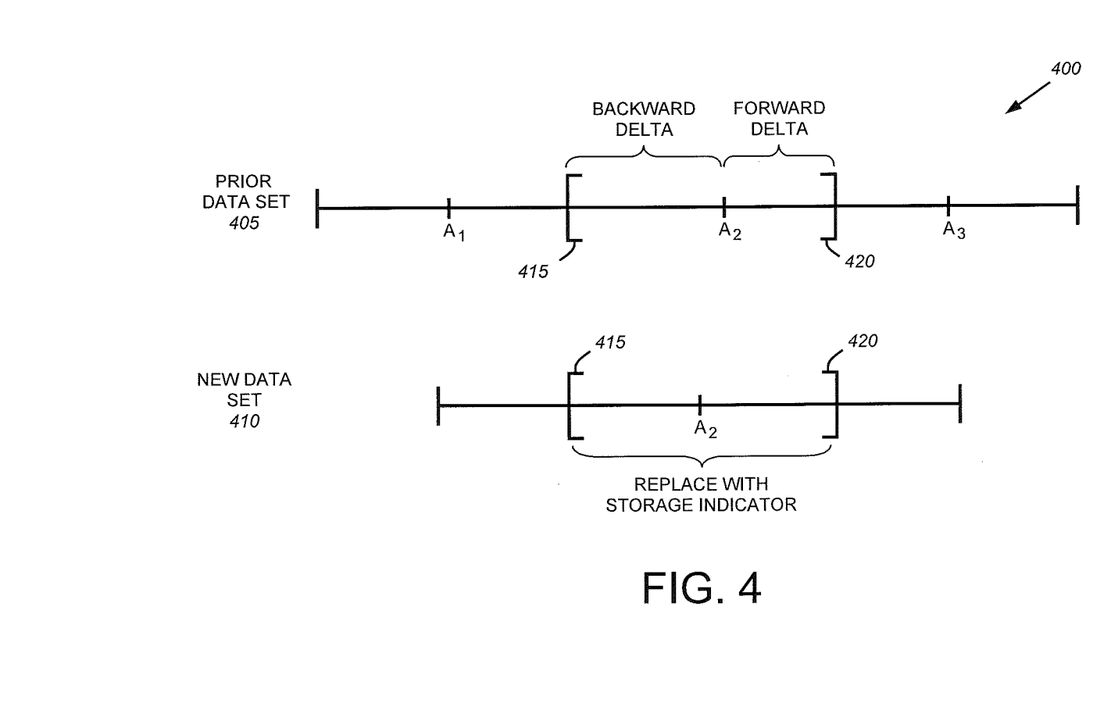
FIG. 4 is a diagram showing the formation of backward and forward deltas around an anchor point in accordance with an embodiment of the present invention.

FIG. 4 is a schematic diagram of an environment 400 showing the generation of backward and forward deltas between a previously stored data set 405 and a new data set 410. In the prior data set 405, i.e., a data set previously received and processed by the VTL system 200, three anchors A1, A2, A3 have been identified. In the new data set 410, i.e., the data set currently being processed it is determined that a single anchor A2 exists. In response, the VTL system 200 begins a bit-by-bit data comparison of the region in front of and behind the anchor A2 in both the prior data set 405 and the new data set 410. Assume that data matches until a forward point 420 and to a backward point 415 on each data set. In such a case, the region between points 415, 420 is replaced with a storage indicator in the new data set 410.

Figure 5:
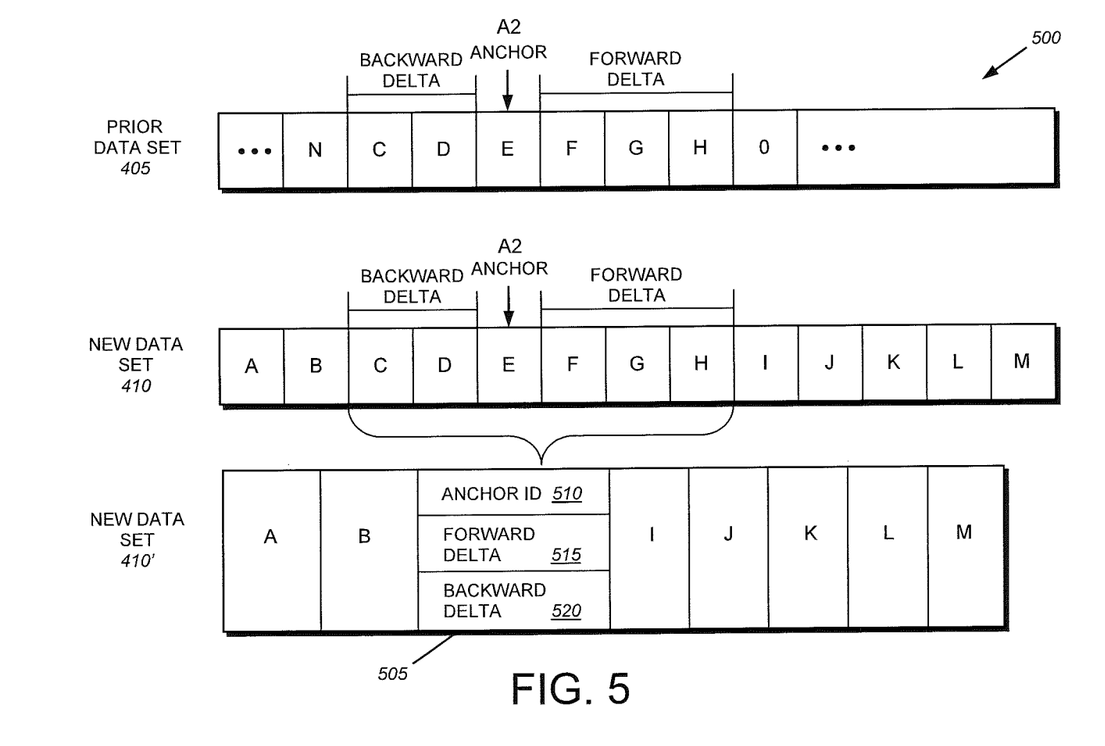
FIG. 5 is a block diagram illustrating the replacement of duplicate data with a storage indicator in accordance with an embodiment of the present invention.

FIG. 5 is a schematic diagram of an environment 500 showing the replacement of data with a storage indicator in accordance with an embodiment of the present invention. Both prior data set 405 and new data set 410 are centered around anchor A2. Within the prior data set 405, the region around the anchor contains data having values N, C, D, E (the anchor point), F, G, H, O, etc. Similarly, the data surrounding the anchor in new data set 410 are A, B, C, D, E (the anchor point), F, G, H, I, etc. In accordance with the illustrative embodiment, once the anchor point is identified, a bit-by-bit comparison occurs forward and backward from the anchor point. A determination is made that only data F, G and H in front of the anchor point of each data set are identical, i.e., next data has the value of O in the prior data set 405 and a value of I in the new data set 410. Similarly, it is determined that only data C and D in back of the anchor point of each data set are identical. These six areas of data (including the anchor E) within the new data set 410 (namely the region between C and H) are then replaced with a storage indicator 505. Accordingly, the new data set 410 is modified to new data set 410' compromising of data A, B, the storage indicator 505, I, J, K, L, M, etc.

Illustratively, the storage indicator 505 comprises an anchor identifier (ID) field 510, a forward delta field 515 and a backward delta field 520. The anchor ID field 510 identifies the anchor associated with this storage indicator 505. The forward and backward delta fields 515, 520 identify the number of consecutive bits on each side of the anchor that have been replaced. Thus, in this example, the forward delta value would identifies the number of bits contained within data F, G and H, while backward delta identifies the number of bits contained within data C and D. When reconstructing the original data (re-duplication), the system retrieves the data stored within the pattern database identified by the storage indicator and inserts it into the reconstructed data. For example, upon identifying that a storage indicator is present, the system locates the identified anchor and retrieves the data backward/forward from the anchor point identified by the delta values. That region is then re-substituted into the data set in place of the storage indicator.

Anchor database 270 is utilized during step 320 to identify the duplicate data between the prior data set 405 and the new data set 410. For new data set 410 being written to the VTL system 200, the VTL could have the knowledge of where duplicate data in the new data set 410 are likely to reside. For example, the new data for the current complete backup will have the most duplicate data with the data for the last complete backup. The regions of duplicate data will also appear in the same order in two complete backup. Therefore, to identify the duplicate data, the anchor points corresponding to the previous complete backup could be sequentially loaded into memory to compare with the anchors in the new data set 410. This allows for very efficient identifications of duplicate data regions with very small memory requirements.

In an alternate embodiment, an anchor hierarchy may be generated by computer super anchors. A super anchor is illustratively generated by computing a hash based on a plurality of adjacent anchors. The number of super anchors would be smaller than the number of anchors, thereby increasing the speed at which super anchors may be identified. If a match is identified on a super anchor, the system has identified a region of duplicate data that spans multiple adjacent anchors.

Furthermore, while this description has been written in terms of storage de-duplication, the principles of the present invention may be utilized to provide de-duplication over communication links. In such an alternate embodiment, the sending system may perform the above described de-duplication technique to minimize the amount of bandwidth utilized in transmitting data. The source and destination systems will need to work to ensure that they share synchronized pattern and anchor databases.

The foregoing description has been directed to specific embodiments of this invention. It will be apparent, however, that other variations and modifications may be made to the described embodiments, with the attainment of some or all of their advantages. For instance, it is expressly contemplated that the teachings of this invention can be implemented as software, including a computer-readable medium having program instructions executing on a computer, hardware, firmware, or a combination thereof. Furthermore, it should be noted that while this description has been written in terms of VTL system, the teachings of the present invention are not so limited. The present invention may be utilized in any computer environment using any data store, including, e.g., a file system. Accordingly this description is to be taken only by way of example and not to otherwise limit the scope of the invention. Therefore, it is the object of the appended claims to cover all such variations and modifications as come within the true spirit and scope of the invention.

What is claimed is:

1. A method for removing duplicate data stored on a storage system, the method comprising:
    performing an operation on a first data set to identify an anchor within the first data set, wherein the anchor defines a starting point in a first region of the first data set for potential data de-duplication;
    determining a number of consecutive bits or bytes of data that match between the first data set and a second data set forwards and backwards from the identified anchor; and
    replacing the matching data in the first data set with an indication of the second data set, the anchor, and the number of matching bits or bytes forwards from the anchor and the number of matching bits or bytes backwards from the anchor.

2. The method of claim 1 wherein the operation comprises a rolling hash on the first data set.

3. The method of claim 1 further comprising:
    determining that the identified anchor already exists within an anchor data store before determining the matching data between the first data set and the second data set;
    determining that a second anchor identified from the operation on the first data set does not already exist in the anchor data store; and
    in response to determining that the second anchor does not already exist in the anchor data store, storing the second anchor in the anchor data store.

4. The method of claim 1 wherein the second data set is stored in a pattern data store.

5. The method of claim 1 further comprising forming an anchor hierarchy by performing an operation on a plurality of adjacent anchors within the first data set.

6. The method of claim 5 wherein the operation on the plurality of adjacent anchors comprises a hash.

7. The method of claim 1 wherein the first data set comprises a backup data stream.

8. A system configured to remove duplicate data, the system comprising:
    a processor;
    a computer readable medium comprising program code stored therein, the program code executable by the processor to cause the system to,
    identify an anchor within a first data set, wherein the anchor defines a starting point in a first region of the first data set for potential data de-duplication;
    determine whether the identified anchor exists within a data store storing a plurality of anchors;
    in response to determining that the anchor exists within the data store, perform a data comparison between the first data set and a second data set forwards from the anchor and backwards from the anchor to determine a forwards delta value and a backwards delta value; and
    replace matching data in the first data set with an indication of the second data set, an indication of the anchor, the forwards delta value, and the backwards delta value.

9. The system of claim 8 wherein the backwards delta value comprises a number of consecutive bits or bytes backwards from the anchor that match between the first and second data sets and the forwards delta value comprises a number of consecutive bits or bytes forwards from the anchor that match between the first and second data sets.

10. The system of claim 8 further comprising a pattern data store configured to store the second data set.

11. The system of claim 8 wherein the program code to identify the anchor comprises program code executable by the processor to cause the system to place the anchor at a predefined location within the first data set.

12. The system of claim 8 wherein the first data set comprises a backup data stream.

13. The system of claim 8 wherein the program code to identify the anchor comprises program code executable by the processor to perform a rolling hash on the first data set.

14. A non-transitory computer readable medium comprising program instructions for data de-duplication, the program instructions:
    program instructions that perform an operation on a first data set to identify an anchor within the first data set, wherein the anchor defines a starting point within a first region of the first data set for potential data de-duplication;
    determine consecutive data forwards from the anchor that matches consecutive data forwards from the anchor in a second data set and consecutive data backwards from the anchor in the first data set that matches consecutive data backwards from the anchor in the second data set, wherein the consecutive forwards matching data is represented with a forwards delta value and the consecutive backwards matching data is represented with a backwards delta value; and
    replace the matching data in the first data set with an indication of the anchor, the second data set, the forwards delta value, and the backwards delta value.

15. The non-transitory computer readable medium of claim 14 further comprising program instructions that determine whether the identified anchor exists within an anchor data store.

16. The non-transitory computer readable medium of claim 14 further comprising program instructions that perform a rolling hash on the first data set to identify the anchor within the first data set.

17. The method of claim 1 further comprising:
    identifying a second anchor within the first data set from performing the operation, wherein the second anchor defines a starting point in a second region of the first data set for potential data de-duplication;
    determining a number of consecutive bits or bytes of data forwards from the second anchor that match between the first and the second data sets and a number of consecutive bits or bytes of data backwards from the second anchor that match between the first and the second data sets; and replacing, in the first data set, the matching data with respect to the second anchor with an indication of the second anchor, the second data set, the number of consecutive bits or bytes of data forwards from the second anchor that match between the first and the second data sets, and the number of consecutive bits or bytes of data backwards from the second anchor that match between the first and the second data sets.

18. The system of claim 8, wherein the computer readable medium further comprises program code executable by the processor to cause the system to:

identify a second anchor within the first data set, wherein the second anchor defines a starting point in a second region of the first data set for potential data de-duplication;

perform a data comparison between the first and the second data sets forwards from the second anchor to determine a forwards delta value and backwards from the second anchor to determine a backwards delta value; and replace, in the first data set, the matching data with respect to the second anchor with an indication of the second anchor, the second data set, the forwards delta value, and the backwards delta value.

19. The non-transitory computer readable medium of claim 14 further comprising program instructions to:

identify a second anchor within the first data set with the operation, wherein the second anchor defines a starting point in a second region of the first data set for potential data de-duplication;

determine consecutive data forwards from the second anchor that matches consecutive data forwards from the second anchor in the second data set and consecutive data backwards from the anchor in the first data set that matches consecutive data backwards from the anchor in the second data set, wherein the consecutive forwards matching data is represented with a forwards delta value and the consecutive backwards matching data is represented with a backwards delta value; and replace, in the first data set, the matching data with respect to the second anchor with an indication of the second anchor, the second data set, the forwards delta value, and the backwards delta value.

* * * * *